US007763855B2

United States Patent
Hayashi et al.

(10) Patent No.: US 7,763,855 B2
(45) Date of Patent: Jul. 27, 2010

(54) INFRARED SENSOR AND METHOD FOR MANUFACTURING INFRARED SENSOR

(75) Inventors: Koji Hayashi, Nagaokakyo (JP); Hitoshi Taga, Imizu (JP); Takeshi Takeda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/233,901

(22) Filed: Sep. 19, 2008

(65) Prior Publication Data
US 2009/0026372 A1    Jan. 29, 2009

Related U.S. Application Data

(63) Continuation of application No. PCT/JP2007/055413, filed on Mar. 16, 2007.

(30) Foreign Application Priority Data

Mar. 22, 2006    (JP)    ............................. 2006-079506
Mar. 16, 2007    (JP)    ............................. 2007-068475

(51) Int. Cl.
*G01J 5/04*    (2006.01)
*G02B 7/02*    (2006.01)

(52) U.S. Cl. ................................................. 250/339.01

(58) Field of Classification Search ............ 250/339.01; G01J 1/02, 1/04, 5/02, 5/04; H01L 31/02, H01L 31/0203, 31/0232; G02B 7/00, 7/02
See application file for complete search history.

(56) References Cited

U.S. PATENT DOCUMENTS 6,480,346 B2 *  11/2002  Funakoshi ................. 359/808

7,598,580 B1 *  10/2009  Hsin et al. .................. 257/432

(Continued)

FOREIGN PATENT DOCUMENTS

EP    0 779 503 A2    6/1997

(Continued)

OTHER PUBLICATIONS

Official Communication issued in International Patent Application No. PCT/JP2007/055413, mailed on April 17, 2007.

*Primary Examiner*—David P Porta
*Assistant Examiner*—David S Baker
(74) *Attorney, Agent, or Firm*—Keating & Bennett, LLP

(57) ABSTRACT

An economical and highly reliable infrared sensor with a wide field of view and a method for economically manufacturing a highly reliable infrared sensor with a wide field of view includes a package having supporting portions that support an optical filter at a location below the upper surfaces of sidewalls of the package and recessed portions that communicate with gaps between side surfaces of the optical filter supported by the supporting portions and the sidewalls of the package. An adhesive is supplied to the recessed portions while the optical filter is supported by the supporting portions such that the adhesive flows into the gaps between the optical filter and the sidewalls of the package by capillary action and such that the optical filter is fixed to an opening of the package via the adhesive. The optical filter is fixed to the package via the adhesive by applying the adhesive such that the adhesive spreads over substantially the entire circumference of the optical filter.

8 Claims, 5 Drawing Sheets

U.S. PATENT DOCUMENTS

| | | |
|---|---|---|
| 2003/0128291 A1 | 7/2003 | Harazono et al. |
| 2005/0270403 A1 | 12/2005 | Adachi et al. |
| 2008/0087824 A1* | 4/2008 | Hayashi et al. .......... 250/338.1 |
| 2008/0251722 A1* | 10/2008 | Hayashi et al. .......... 250/338.1 |
| 2009/0212218 A1* | 8/2009 | Hayashi et al. .......... 250/338.1 |
| 2010/0025792 A1* | 2/2010 | Yamada et al. ............... 257/432 |

FOREIGN PATENT DOCUMENTS

| | | |
|---|---|---|
| JP | 07-183415 A | 7/1995 |
| JP | 07-043780 U | 9/1995 |
| JP | 08-015007 A | 1/1996 |
| JP | 2002-071457 A | 3/2002 |
| JP | 2003-163297 A | 6/2003 |
| JP | 2005-303071 A | 10/2005 |

* cited by examiner

INFRARED SENSOR AND METHOD FOR MANUFACTURING INFRARED SENSOR

BACKGROUND OF THE INVENTION

1. Field of the Invention

The present invention relates to infrared sensors and methods for manufacturing infrared sensors. In particular, the present invention relates to infrared sensors including optical filters disposed in openings of packages that accommodate infrared sensor elements, the optical filters functioning to deliver infrared rays having a predetermined wavelength to the infrared sensor elements and define lids to seal the openings of the packages, and to methods for manufacturing the infrared sensors.

2. Description of the Related Art

As shown in FIG. 5, a known optical semiconductor device 51 includes a base (package) 54 having a recessed portion 54a provided in the top surface thereof, an optical semiconductor element 52 disposed on the bottom surface of the recessed portion 54a, and a tabular light transmitting cover (optical filter) 53 attached to the top surface of the base 54 surrounding the recessed portion 54a via an ultraviolet curable resin 55 (see Japanese Unexamined Patent Application Publication No. 2003-163297).

In the optical semiconductor device 51, a main surface of the light transmitting cover 53 adjacent to the recessed portion 54a is coated with an optical thin film 53a to block light beams in a predetermined wavelength band, and a portion of the optical thin film 53a in an area 53b in which the light transmitting cover 53 is bonded to the top surface of the base (package) 54 surrounding the recessed portion 54a is mechanically removed so that the bonding strength between the light transmitting cover 53 defining an optical filter and the base 54 is improved. This optical semiconductor device including the light transmitting cover 53 is capable of being produced at low cost and is compact and highly reliable.

However, the optical semiconductor device 51 described in Japanese Unexamined Patent Application Publication No. 2003-163297, in which the optical thin film 53a of the light transmitting cover (optical filter) 53 at a bonding surface to be bonded to the base (package) 54 is removed and the light transmitting cover (optical filter) 53 is bonded to the base (package) 54 at the bonding surface as described above, has the following problems.

Since the optical filter, which is expensive, is bonded to the package at the outer periphery of the light receiving surface of the optical filter, the optical filter does not function at the outer periphery, resulting in an increase in cost.

The amount of adhesive applied or the state of the applied adhesive may vary, and adhesion failure or oozing of the adhesive to portions other than the bonding portion may result. When such an optical semiconductor device is applied to an infrared sensor used for, for example, detection of human bodies and security equipment, the detection range may be reduced, and the field-of-view characteristics may vary.

In order to obtain a sufficient bonding strength during bonding, it is necessary to chemically or mechanically remove the optical thin film at the bonding portion. This complicates the manufacturing processes and increases the cost thereof.

SUMMARY OF THE INVENTION

To overcome the problems described above, preferred embodiments of the present invention provide an economical and highly reliable infrared sensor having a wide field of view and a method for economically manufacturing a highly reliable infrared sensor having a wide field of view without complicated manufacturing processes.

An infrared sensor according to a preferred embodiment of the present invention includes an infrared sensor element, a box-shaped, surface-mounting-compatible package having an opening at one of the surfaces thereof, the infrared sensor element being accommodated inside the package, and an optical filter that allows passage of infrared rays having a predetermined wavelength through substantially the entire surface thereof and is arranged so as to cover substantially the entire opening of the package, the optical filter having a function of delivering infrared rays having the predetermined wavelength to the infrared sensor element and defining a lid to seal the opening of the package at the same time. In the infrared sensor, the package includes supporting portions that support the optical filter at a location below the upper surfaces of sidewalls of the package and recessed portions that communicate with gaps between side surfaces of the optical filter supported by the supporting portions and the sidewalls of the package, and the optical filter is fixed to the package by an adhesive applied between the sidewalls of the package and the side surfaces of the optical filter while the optical filter is supported by the supporting portions.

Preferably, the planar shapes of the opening of the package and the optical filter are substantially rectangular.

Preferably, the recessed portions are provided in the sidewalls adjacent to four corners of the opening.

Preferably, the adhesive is applied so as to spread into the gaps between the sidewalls of the package and the side surfaces of the optical filter over substantially the entire circumference of the optical filter, and the optical filter is arranged such that the interior of the package is hermetically sealed.

A method for manufacturing an infrared sensor according to a preferred embodiment of the present invention, the infrared sensor including an infrared sensor element, a substantially box-shaped, surface-mounting-compatible package having an opening at one surfaces thereof, the infrared sensor element being accommodated inside the package, and an optical filter that allows passage of infrared rays having a predetermined wavelength through substantially the entire surface thereof and is disposed so as to cover substantially the entire opening of the package, the optical filter having a function of delivering infrared rays having the predetermined wavelength to the infrared sensor element and defining a lid to seal the opening of the package at the same time, includes the steps of preparing the package to include supporting portions that support the optical filter at a location below top ends of sidewalls of the package and recessed portions that communicate with gaps between side surfaces of the optical filter supported by the supporting portions and the sidewalls of the package, and supplying an adhesive to the recessed portions while the optical filter is supported by the supporting portions such that the adhesive flows into the gaps between the optical filter and the sidewalls of the package by capillary action and such that the optical filter is fixed to the package via the adhesive.

Preferably, in this preferred embodiment of the present invention, the planar shapes of the opening of the package and the optical filter are substantially rectangular.

Preferably, in this preferred embodiment of the present invention, the recessed portions are formed in the sidewalls of the package adjacent to the four corners of the opening, and the adhesive is supplied to the recessed portions while the optical filter is supported by the supporting portions such that the adhesive flows into the gaps between the optical filter and the sidewalls of the package by capillary action.

Preferably, in this preferred embodiment of the present invention, the optical filter is fixed to the package via the adhesive by applying the adhesive such that the adhesive spreads over substantially the entire circumference of the optical filter and such that the interior of the package is hermetically sealed.

The package preferably includes the supporting portions that support the optical filter at a position below the upper surfaces of the sidewalls of the package and the recessed portions that communicate with the gaps between the side surfaces of the optical filter supported by the supporting portions and the sidewalls of the package, and the optical filter is fixed to the package by the adhesive applied between the sidewalls of the package and the side surfaces of the optical filter while the optical filter is supported by the supporting portions as described above. With this configuration, the adhesive does not flow to the light transmitting area (light receiving area) of the optical filter, resulting in a highly reliable infrared sensor, in which the optical filter is reliably fixed to the package via the adhesive, with desired field-of-view characteristics.

Moreover, in the infrared sensor according to preferred embodiments of the present invention, no space in the light transmitting area (light receiving area) of the optical filter is provided as a bonding portion to fix the optical filter to the package using the adhesive. Thus, the optical filter, which is made of an expensive material, can be efficiently utilized, to thereby prevent an increase in cost.

Furthermore, since no space in the light transmitting area of the optical filter is provided as the bonding portion, a process to remove the optical thin film formed on the light receiving surface of the optical filter is not required. This also prevents an increase in cost.

Moreover, when the planar shapes of the opening of the package and the optical filter are substantially rectangular, the adhesive can be reliably applied to the linear gaps between the sidewalls of the package and the side surfaces of the optical filter. With this arrangement, a highly reliable infrared sensor having a simple structure in which the optical filter is more reliably fixed to the package via the adhesive can be provided.

Typically, the optical filter used as an infrared filter is expensive, and the shape of the optical filter is preferably substantially rectangular so that the number of optical filters obtained from a mother board for the optical filters is increased. In addition, the shape of the optical filter is also preferably substantially rectangular to facilitate division of the mother board.

Moreover, when the recessed portions are provided in the sidewalls adjacent to the four corners of the opening, a highly reliable infrared sensor, in which the optical filter is reliably fixed to the package via the adhesive, with desired field-of-view characteristics can be obtained by a manufacturing method in which, for example, the adhesive is supplied to the recessed portions so as to spread into the gaps between the sidewalls of the package and the side surfaces of the optical filter by a capillary action.

In addition, when the adhesive is applied so as to flow into the gaps between the sidewalls of the package and the side surfaces of the optical filter over substantially the entire circumference of the optical filter, and the optical filter is fixed to the package such that the interior of the package is hermetically sealed as in the infrared sensor, a more highly reliable infrared sensor in which the optical filter is more reliably fixed to the package via the adhesive and the interior thereof is hermetically sealed can be obtained.

That is, the optical filter is bonded to the sidewalls of the package using the adhesive such that the interior of the package is hermetically sealed by supplying the adhesive such that the adhesive flows into the gaps between the sidewalls of the package and the side surfaces of the optical filter over substantially the entire circumference of the optical filter. With this arrangement, a highly reliable infrared sensor in which the optical filter is reliably fixed to the package via the adhesive and the interior thereof is hermetically sealed can be obtained.

Moreover, in a method for manufacturing the infrared sensor according to a preferred embodiment of the present invention, the package is prepared so as to arrange the supporting portions that support the optical filter at a location below the upper surfaces of the sidewalls of the package and the recessed portions that communicate with the gaps between the side surfaces of the optical filter supported by the supporting portions and the sidewalls of the package, and the adhesive is supplied to the recessed portions while the optical filter is supported by the supporting portions such that the adhesive flows into the gaps between the optical filter and the sidewalls of the package by capillary action and such that the optical filter is fixed to the package via the adhesive as described above. With this arrangement, a highly reliable infrared sensor, in which the optical filter is reliably fixed to the package via the adhesive, having a wide field of view and no reduction in the light transmitting area (field of view) of the optical filter caused when the adhesive flows to the surface of the optical filter can be efficiently manufactured.

The optical filter can preferably be fixed to the package via the adhesive since the adhesive flows into the gaps between the side surfaces of the optical filter and the sidewalls of the package by capillary action by only supplying the adhesive to the recessed portions while the optical filter is supported by the supporting portions. Thus, the manufacturing processes can be simplified, and the manufacturing costs can be reduced.

Moreover, since an amount of adhesive required to bond the optical filter to the package can be easily disposed in the recessed portions, a stable bonding strength necessary to bond the optical filter can be achieved, which results in improvement reliability.

Moreover, when the planar shapes of the opening of the package and the optical filter are substantially rectangular as in the method for manufacturing the infrared sensor according to the preferred embodiment described above, the adhesive flows into the linear gaps between the optical filter and the sidewalls of the package by capillary action. With this arrangement, a highly reliable infrared sensor in which the optical filter is more reliably fixed to the package via the adhesive can be efficiently manufactured.

Moreover, when the recessed portions are provided in the sidewalls of the package adjacent to the four corners of the opening and the adhesive is supplied to the recessed portions while the optical filter is supported by the supporting portions, the starting points of the adhesive flow are located at substantially symmetrical locations (diagonal locations) of the circumference of the optical filter. With this arrangement, the reliability of bonding the optical filter to the package using the adhesive can be further improved.

Moreover, when the optical filter is fixed to the package via the adhesive by applying the adhesive such that the adhesive flows over substantially the entire circumference of the optical filter and such that the interior of the package is hermetically sealed, a more highly reliable infrared sensor in which the optical filter is reliably fixed to the package via the adhesive and the interior thereof is hermetically sealed can be efficiently manufactured.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Features of the present invention will now be described with reference to preferred embodiments of the present invention.

First Preferred Embodiment

Figure 1:
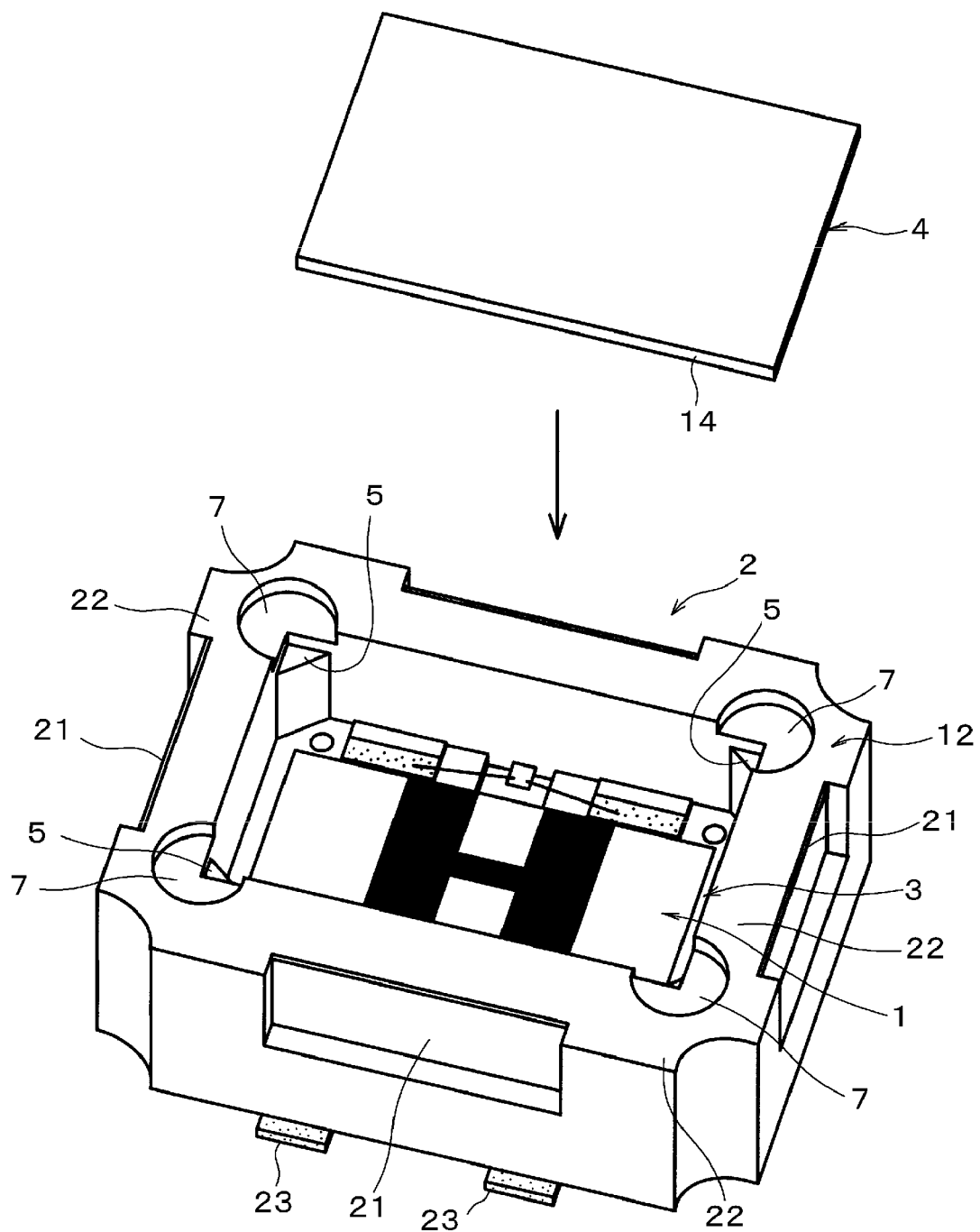
FIG. 1 is an exploded perspective view illustrating an infrared sensor according to a preferred embodiment of the present invention.
Figure 2:
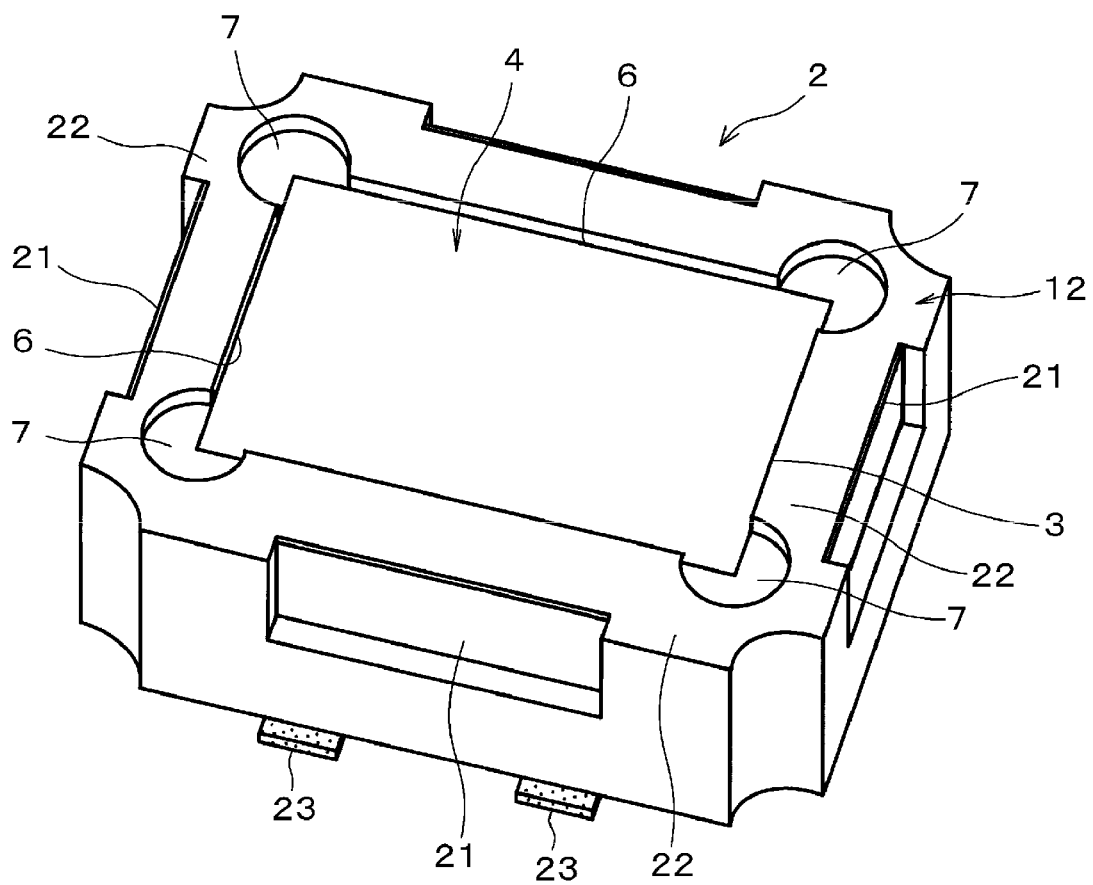
FIG. 2 illustrates a state in which an optical filter is set in position on a package defining the infrared sensor according to a preferred embodiment of the present invention.
Figure 3:
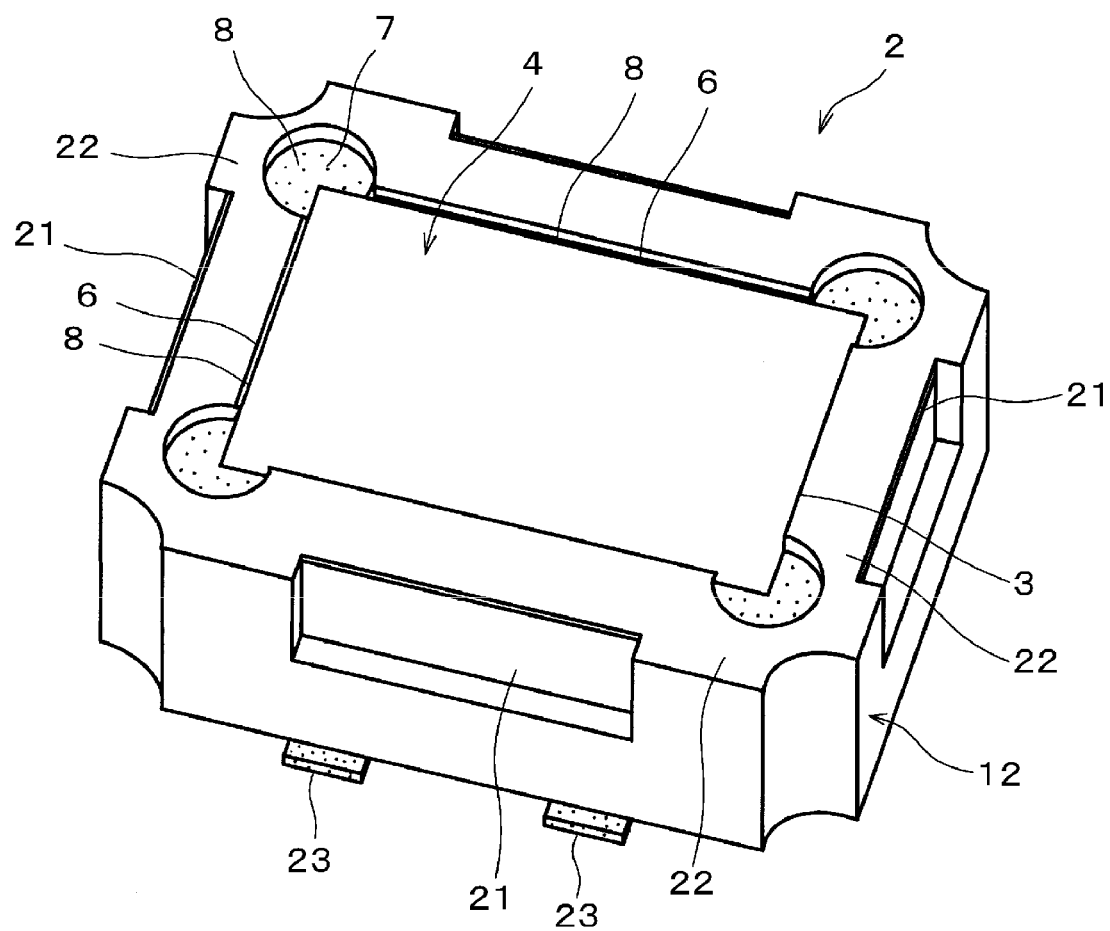
FIG. 3 illustrates a state in which an adhesive is applied to recessed portions provided in the package such that the adhesive flows into gaps between the optical filter and sidewalls of the package by capillary action in a process of manufacturing the infrared sensor according to a preferred embodiment of the present invention.
Figure 4:
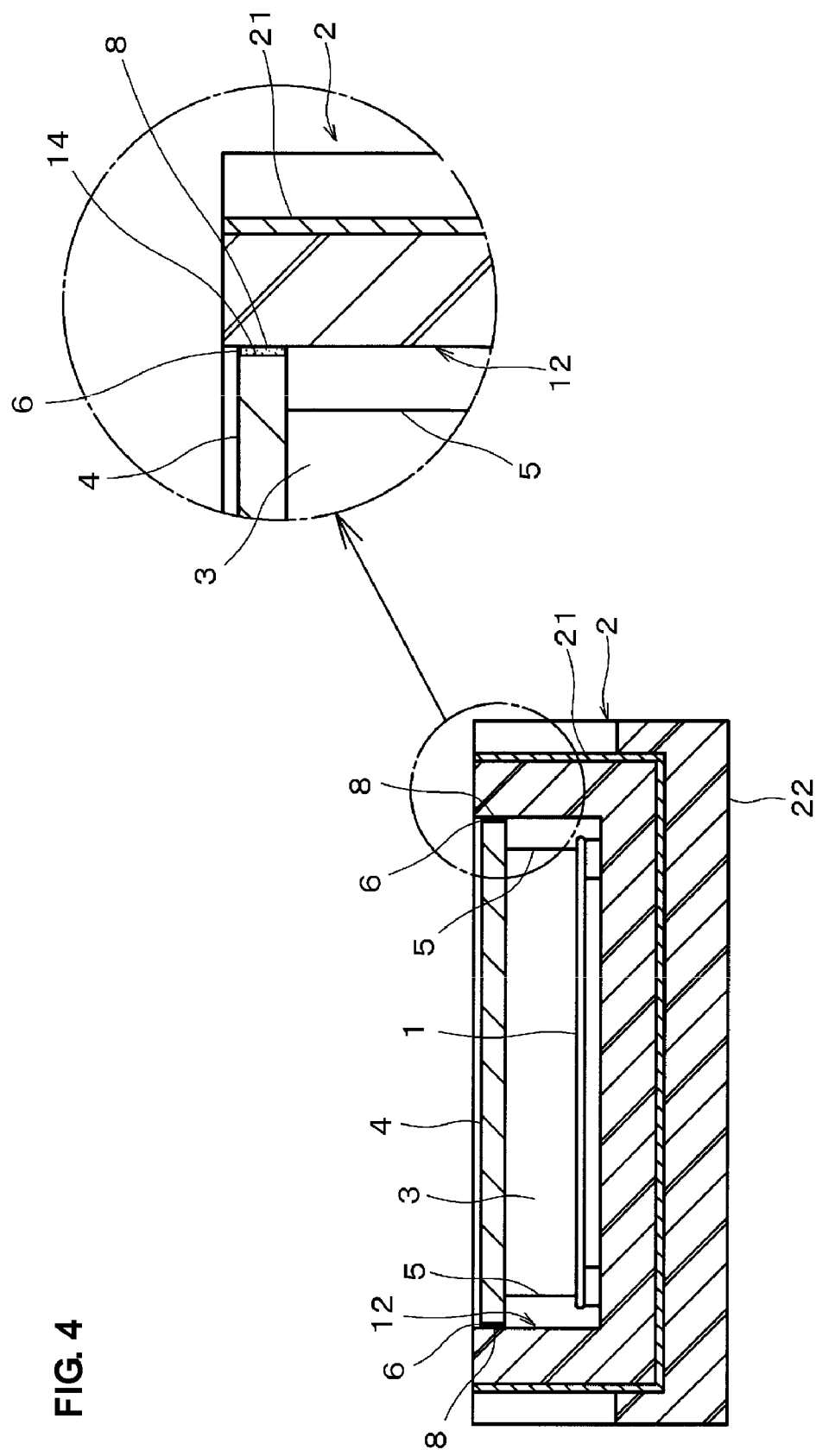
FIG. 4 is a cross-sectional view illustrating a state in which the optical filter defining the infrared sensor according to a preferred embodiment of the present invention is fixed to the package via the adhesive.
Figure 5:
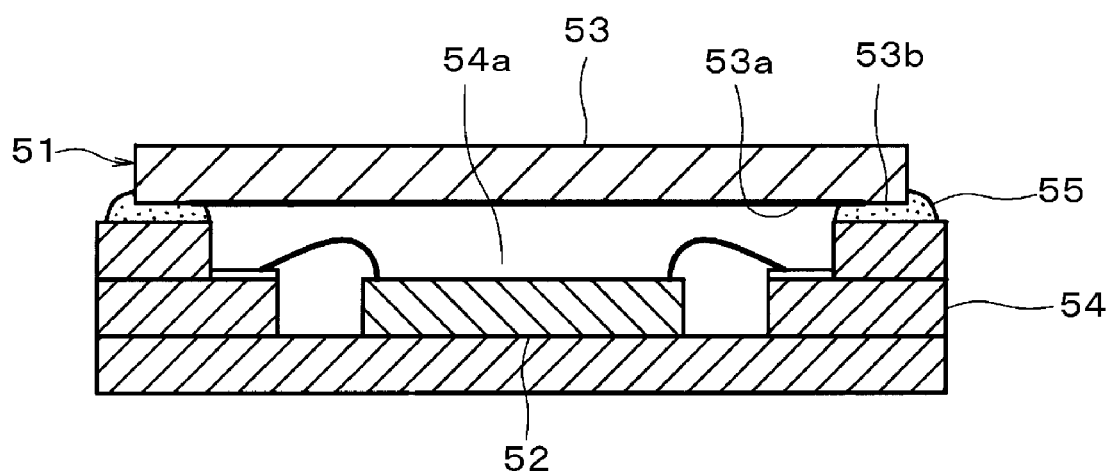
FIG. 5 illustrates the structure of a known optical semiconductor device.

FIG. 1 is an exploded perspective view illustrating an infrared sensor according to a first preferred embodiment of the present invention. FIG. 2 illustrates a state in which an optical filter is set in location on a package defining the infrared sensor. FIG. 3 illustrates a state in which an adhesive is applied to recessed portions provided in the package such that the adhesive flows into gaps between the optical filter and sidewalls of the package by a capillary action. FIG. 4 is a cross-sectional view illustrating a state in which the optical filter defining the infrared sensor is fixed to the package via the adhesive.

As shown in FIGS. 1 to 3, the infrared sensor according to this preferred embodiment includes an infrared sensor element 1, a substantially box-shaped, surface-mounting-compatible package 2 in which a wiring pattern is provided and the infrared sensor element 1 is accommodated, and an optical filter (infrared filter) 4 that allows passage of infrared rays having a predetermined wavelength through substantially the entire surface thereof and is disposed so as to cover substantially the entire opening 3 of the package 2. The optical filter 4 is arranged to deliver infrared rays having the predetermined wavelength to the infrared sensor element 1 and also functions as a lid to seal the opening 3 of the package 2.

The substantially planar shape of the opening 3 of the package 2 defining the infrared sensor is substantially rectangular, and the planar shape of the optical filter 4 is also substantially rectangular so as to correspond to that of the opening 3. In the infrared sensor according to this preferred embodiment, the optical filter 4 is preferably made of, for example, monocrystalline silicon that allows infrared rays having a predetermined wavelength to pass therethrough.

Moreover, the package 2 defining the infrared sensor is preferably made of a metallic body 21 having a majority thereof covered with an insulating cover 22 preferably made of, for example, a liquid-crystal polymeric resin. External terminal electrodes 23 that are electrically connected to the wiring pattern inside the package 2 are arranged at predetermined locations of the lower portion of the package 2 so as to be insulated from the body 21 of the package 2.

The package 2 includes supporting portions 5 that support the optical filter 4 at a location below the upper surfaces of sidewalls 12 of the package 2 and recessed portions 7 that communicate with gaps 6 between the side surfaces of the optical filter 4 supported by the supporting portions 5 and the sidewalls 12 of the package 2. The optical filter 4 is fixed to the package 2 by an adhesive 8 applied between the sidewalls 12 of the package 2 and the side surfaces 14 of the optical filter 4 while being supported by the supporting portions 5.

Moreover, the recessed portions 7 are preferably provided in the upper surfaces of the sidewalls 12 adjacent to the four corners of the opening 3. The recessed portions 7 are preferably substantially circular, and portions of the recessed portions 7 communicate with the gaps 6 between the side surfaces of the optical filter 4 and the sidewalls 12 of the package 2.

The adhesive 8 flows from the recessed portions 7 into the gaps 6 between the sidewalls 12 of the package 2 and the side surfaces 14 of the optical filter 4 over substantially the entire circumference of the optical filter 4. The side surfaces 14 of the optical filter 4 are bonded to the sidewalls 12 of the package 2 by the adhesive 8 such that the interior of the package 2 is hermetically sealed.

In the infrared sensor according to this preferred embodiment, the adhesive does not flow to the light transmitting area (light receiving area) of the optical filter 4 since the adhesive 8 enters the gaps 6 between the sidewalls 12 of the package 2 and the side surfaces 14 of the optical filter 4. Thus, desired field-of-view characteristics can be achieved, and a highly reliable infrared sensor in which the optical filter 4 is reliably fixed to the package 2 via the adhesive 8 can be obtained.

Moreover, in the infrared sensor according to this preferred embodiment, substantially no space in the light transmitting area (light receiving area) of the optical filter 4 is used as a bonding portion for fixing the optical filter 4 to the package 2 using the adhesive 8. Thus, the optical filter 4, which is made of an expensive material, can be efficiently utilized, to thereby prevent an increase in cost.

Furthermore, since no space in the light transmitting area of the optical filter 4 is used as the bonding portion, a process for removing the optical thin film formed in the light transmitting area of the optical filter, for example, which was necessary in the known technology, is no longer required. This also reduces the cost.

Moreover, the planar shapes of the opening 3 of the package 2 and the optical filter 4 preferably are substantially rectangular, and the recessed portions 7 are preferably provided in the upper surfaces of the sidewalls 12 adjacent to the four corners of the opening 3. With this simplified structure, the adhesive 8 can be reliably applied to the gaps 6 between the sidewalls 12 of the package 2 and the side surfaces 14 of the optical filter 4, which results in a highly reliable infrared sensor in which the optical filter 4 is more reliably fixed to the package 2 via the adhesive 8.

Furthermore, the planar areas of the recessed portions 7 are preferably larger than the areas of supporting surfaces of the supporting portions 5 that support the optical filter 4. Although it is not easy to apply the adhesive to portions adjacent to the four corners of the package 2, a sufficient amount of adhesive 8 can be applied by increasing the areas of the recessed portions 7 as compared to those of the supporting portions 5 which support the optical filter 4, and the four corners of the optical filter 4 can be more reliably connected to the package 2 using the adhesive 8. Thus, the structure can be maintained air-tight.

Moreover, the optical filter 4 preferably made of, for example, monocrystalline silicon, is not expensive, and the shape of the optical filter 4 is preferably substantially rectangular so that the number of optical filters produced from a mother board for the optical filters is increased. Furthermore, the shape of the optical filter is also preferably substantially rectangular to facilitate division of the mother board.

In addition, in the infrared sensor according to this preferred embodiment, the adhesive 8 is applied to the gaps 6 between the sidewalls 12 of the package 2 and the side surfaces 14 of the optical filter 4 and surrounds substantially the entire circumference of the optical filter 4 such that the interior of the package 2 is hermetically sealed, which results in a highly reliable infrared sensor in which the infrared sensor element 1 is accommodated inside the hermetically sealed package 2 and the optical filter 4 that functions as a lid to sealing the opening 3 is reliably fixed to the opening 3 of the package 2.

Next, a method for manufacturing the infrared sensor according to a preferred embodiment of the present invention will be described.

In order to manufacture the infrared sensor according to this preferred embodiment, the package 2 is prepared so as to have the supporting portions 5 that support the optical filter 4 at a location below the upper surface of the sidewalls 12 of the package 2 and the recessed portions 7 (the recessed portions 7 having a circular planar shape formed in the top surfaces of the sidewalls 12 of the package 2 at the four corners) that communicate with the gaps 6 between the side surfaces 14 of the optical filter 4 supported by the supporting portions 5 and the sidewalls 12 of the package 2 as shown in FIG. 1.

Moreover, the optical filter 4 is prepared so as to preferably have gaps 6 of about 0.02 mm to about 0.1 mm, for example, between the side surfaces 14 of the optical filter and the sidewalls 12 of the package 2.

Subsequently, the optical filter 4 is arranged so as to be supported by the supporting portions 5. The gaps 6 preferably of about 0.02 mm to about 0.1 mm, for example, are formed between the side surfaces 14 of the optical filter 4 and the sidewalls 12 of the package 2 as described above.

A predetermined amount of adhesive 8 having a predetermined flowability is then supplied to each of the recessed portions 7 provided in the upper surfaces of the sidewalls 12 of the package 2 preferably at the four corners such that the adhesive 8 infiltrates from the recessed portions 7 into the gaps 6 preferably of about 0.02 mm to about 0.1 mm between the optical filter 4 and the sidewalls 12 of the package 2 by capillary action over substantially the entire circumference of the optical filter 4.

Next, when the adhesive 8 is, for example, a thermosetting adhesive, the adhesive 8 is cured by heating to a predetermined temperature such that the optical filter 4 is fixed to the sidewalls 12 at a location adjacent to the opening 3 of the package 2 via the adhesive 8.

With this process, a highly reliable infrared sensor in which the optical filter 4 is reliably fixed to the package 2 via the adhesive 8 and the interior thereof is hermetically sealed can be obtained.

According to the above-described manufacturing method, the adhesive 8 flows into the gaps 6 between the optical filter 4 and the sidewalls 12 of the package 2 by a capillary action by only using the above-described package 2 having the recessed portions 7 and supplying the adhesive 8 to the recessed portions 7 while the optical filter 4 is supported by the supporting portions 5. With this method, a highly reliable infrared sensor can be efficiently manufactured without complicated manufacturing processes and without a reduction in the light transmitting area of the optical filter 4 caused when the adhesive 8 obstructs the light transmitting area of the optical filter 4.

In the above-described preferred embodiments, the recessed portions 7 are preferably provided in the upper surfaces of the sidewalls 12 of the package 2 at the four corners. However, the recessed portions 7 are not necessarily provided at the four corners, and may be provided at other locations, for example, at the approximate center of each side.

Moreover, the number of the recessed portions 7 is also not specifically limited, and the number can be determined in view of, for example, the size of the optical filter 4 and the viscosity of the adhesive 8.

Moreover, in the above-described preferred embodiments, the adhesive 8 spreads over substantially the entire circumference of the optical filter 4. However, the adhesive 8 does not necessarily need to spread over substantially the entire circumference of the optical filter 4, and the optical filter 4 can be connected to the package 2 at predetermined locations.

Moreover, in the above-described preferred embodiments, the planar shapes of the opening 3 of the package 2 and the optical filter 4 are preferably substantially rectangular. However, the planar shapes thereof can be, for example, substantially circular or substantially elliptical.

The present invention is also not limited to the above-described preferred embodiments in other respects. Various applications and modifications in, for example, the specific structure of the infrared sensor element; the dimensions and the shapes of the package and the optical filter; the depth, the planar area, and the planer shape of the recessed portions formed in the package; the cross-sectional shape of the recessed portions substantially perpendicular to the bottom surface; the specific structure of the optical filter; the material of the optical filter; and the type and the viscosity of the adhesive are possible within the scope of the present invention.

According to preferred embodiments of the present invention, the adhesive flows into the gaps between the optical filter and the sidewalls of the package by capillary action by supplying the adhesive to the recessed portions provided in the sidewalls of the package while the optical filter is supported by the supporting portions, and the side surfaces of the optical filter are fixed to the package via the adhesive as described above. With this arrangement, a highly reliable infrared sensor, in which the optical filter is reliably fixed to the package via the adhesive, with a wide field of view can be efficiently manufactured without a reduction in the light transmitting area of the optical filter.

Accordingly, the present invention is suitable for use in a wide variety of general-purpose infrared sensor applications such as, for example, detection of human bodies and security equipment.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An infrared sensor comprising:

an infrared sensor element;

a substantially box-shaped, surface-mounting-compatible package having an opening, the infrared sensor element being accommodated inside the package; and an optical filter arranged to allow passage of infrared rays having a predetermined wavelength through substantially an entire surface thereof and to cover substantially the entire opening of the package, the optical filter arranged to deliver infrared rays having the predetermined wavelength to the infrared sensor element and to define a lid to seal the opening of the package; wherein the package includes supporting portions each having a supporting surface arranged to support the optical filter at a location below upper surfaces of sidewalls of the package and recessed portions that communicate with gaps between side surfaces of the optical filter supported by the supporting portions and the sidewalls of the package;

the optical filter is fixed to the package by an adhesive disposed between the sidewalls of the package and the side surfaces of the optical filter while the optical filter is supported by the supporting portions; and a planar area of each of the recessed portions is greater than a planar area of the supporting surface of each of the supporting portions.

2. The infrared sensor according to claim 1, wherein planar shapes of the opening of the package and the optical filter are substantially rectangular.

3. The infrared sensor according to claim 2, wherein the recessed portions are provided in the sidewalls adjacent to four corners of the opening.

4. The infrared sensor according to claim 1, wherein the adhesive is disposed in the gaps between the sidewalls of the package and the side surfaces of the optical filter over substantially the entire circumference of the optical filter, and the optical filter is arranged such that the interior of the package is hermetically sealed.

5. A method for manufacturing an infrared sensor including an infrared sensor element, a substantially box-shaped, surface-mounting-compatible package having an opening, the infrared sensor element being accommodated inside the package, and an optical filter arranged to allow passage of infrared rays having a predetermined wavelength through substantially an entire surface thereof and being arranged so as to cover substantially the entire opening of the package, the optical filter delivering infrared rays having the predetermined wavelength to the infrared sensor element and functioning as a lid to seal the opening of the package, the method comprising:

preparing the package so as to include supporting portions each having a supporting surface that supports the optical filter at a location below upper surfaces of sidewalls of the package and recessed portions that communicate with gaps between side surfaces of the optical filter supported by the supporting portions and the sidewalls of the package; and supplying an adhesive to the recessed portions while the optical filter is supported by the supporting portions such that the adhesive flows into the gaps between the optical filter and the sidewalls of the package by capillary action and such that the optical filter is fixed to the package via the adhesive; wherein the package is prepared such that a planar area of each of the recessed portions is greater than a planar area of the supporting surface of each of the supporting portions.

6. The method for manufacturing the infrared sensor according to claim 5, wherein planar shapes of the opening of the package and the optical filter are substantially rectangular.

7. The method for manufacturing the infrared sensor according to claim 6, wherein the recessed portions are formed in the sidewalls of the package adjacent to four corners of the opening, and the adhesive is supplied to the recessed portions while the optical filter is supported by the supporting portions such that the adhesive flows into the gaps between the optical filter and the sidewalls of the package by a capillary action.

8. The method for manufacturing the infrared sensor according to claim 5, wherein the optical filter is fixed to the package via the adhesive by applying the adhesive such that the adhesive spreads over substantially the entire circumference of the optical filter and such that the interior of the package is hermetically sealed.

* * * * *